US012756363B2

(12) United States Patent
Dawson et al.

(10) Patent No.: US 12,756,363 B2
(45) Date of Patent: Oct. 6, 2026

(54) DOHERTY AMPLIFIER SYSTEM

(71) Applicant: Qorvo US, Inc., Greensboro, NC (US)

(72) Inventors: Joel Lawrence Dawson, Roslindale, MA (US); Gangadhar Burra, Fremont, CA (US); Mark Briffa, Tyreso (SE); Jeffrey Gengler, Mckinney, TX (US); Nikolaus Klemmer, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 504 days.

(21) Appl. No.: 18/279,116

(22) PCT Filed: Nov. 3, 2021

(86) PCT No.: PCT/US2021/057801
§ 371 (c)(1),
(2) Date: Aug. 28, 2023

(87) PCT Pub. No.: WO2022/197334
PCT Pub. Date: Sep. 22, 2022

(65) Prior Publication Data

US 2024/0154574 A1 May 9, 2024

Related U.S. Application Data

(60) Provisional application No. 63/163,209, filed on Mar. 19, 2021.

(51) Int. Cl.
*H03F 1/07* (2006.01)
*H03F 1/02* (2006.01)
(Continued)

(52) U.S. Cl.
CPC ........... *H03F 1/0288* (2013.01); *H03F 3/245* (2013.01); *H03F 3/211* (2013.01); *H03F 3/602* (2013.01); *H03F 2200/451* (2013.01)

(58) Field of Classification Search
CPC .................. H03F 1/0288; H03F 3/245; H03F 2200/451; H03F 2200/15; H03F 2200/18;
(Continued)

(56) References Cited

U.S. PATENT DOCUMENTS

| | | | |
|---|---|---|---|
| 7,457,617 | B2 | 11/2008 | Adams et al. |
| 10,103,690 | B2 | 10/2018 | Yanduru et al. |

(Continued)

FOREIGN PATENT DOCUMENTS

| | | | |
|---|---|---|---|
| EP | 2372905 | A1 | 10/2011 |
| EP | 3089359 | A1 | 11/2016 |

OTHER PUBLICATIONS

Disclosed Anonymously, “Doherty amplifer with cooperative power tracking and bias adaption for high efficiency,” Research Disclosure, Database No. 578037, Jun. 2012, published online May 2012, 27 pages.

(Continued)

*Primary Examiner* — Khanh V Nguyen
(74) *Attorney, Agent, or Firm* — Withrow & Terranova, P.L.L.C.

(57) ABSTRACT

A Doherty amplifier system (10) is disclosed having a carrier amplifier (12) with a carrier drain bias input (14), and a peak amplifier (24) having a peak drain bias input (26), and a peak gate bias input (28). Also included is a programmable bias controller (40) having a data interface configured to receive peak-to-average power ratio (PAPR) data associated with a basestation. The programmable bias controller (40) further includes a processor (46) coupled to the data interface and configured, in response to the PAPR data, to determine and apply bias levels to the carrier drain bias input (14), the peak drain bias input (26), and the peak gate bias input (28) to provide an amplifier efficiency between 30% and 78.5%.

16 Claims, 3 Drawing Sheets

(51) Int. Cl.

| | |
|---|---|
| ***H03F 3/24*** | (2006.01) |
| ***H03F 3/68*** | (2006.01) |
| *H03F 3/21* | (2006.01) |
| *H03F 3/60* | (2006.01) |

(58) Field of Classification Search
CPC ......... H03F 2200/321; H03F 2200/393; H03F 3/19; H03F 1/0272; H03F 3/68; H03F 3/211; H03F 3/195; H03F 3/602
USPC .............................................. 330/124 R, 295
See application file for complete search history.

(56) References Cited

U.S. PATENT DOCUMENTS

| | | | |
|---|---|---|---|
| 10,804,866 | B2 | 10/2020 | Lehtola |
| 11,043,921 | B2 * | 6/2021 | Scott ......................... H03F 3/24 |
| 11,101,775 | B2 | 8/2021 | Datta et al. |
| 2007/0139105 | A1 | 6/2007 | Kennan |
| 2009/0140887 | A1 | 6/2009 | Breed et al. |
| 2013/0163647 | A1 | 6/2013 | Hagisawa et al. |
| 2016/0072447 | A1 | 3/2016 | Seth et al. |
| 2016/0153961 | A1 | 6/2016 | Kuramochi |
| 2016/0315586 | A1 | 10/2016 | Itagaki et al. |
| 2017/0063316 | A1 | 3/2017 | Akbarpour et al. |
| 2017/0163217 | A1 | 6/2017 | Bonebright et al. |
| 2019/0058448 | A1 | 2/2019 | Seebacher et al. |
| 2019/0089070 | A1 | 3/2019 | Zihir et al. |
| 2019/0158047 | A1 | 5/2019 | Watkins |
| 2019/0379335 | A1 | 12/2019 | Scott et al. |
| 2020/0014338 | A1 | 1/2020 | Datta et al. |
| 2020/0028472 | A1 | 1/2020 | Scott et al. |
| 2020/0112287 | A1 | 4/2020 | Pham et al. |
| 2021/0257974 | A1 | 8/2021 | Wu |
| 2022/0239261 | A1 | 7/2022 | Ishihara |
| 2023/0198469 | A1 | 6/2023 | Ladhani et al. |
| 2023/0261614 | A1 | 8/2023 | Poulton et al. |

OTHER PUBLICATIONS

Gustafsson, D. et al., “A Novel Wideband and Reconfigurable High Average Efficiency Power Amplifier,” 2012 IEEE/MTT-S International Microwave Symposium Digest, Jun. 17-22, 2012, Montreal, QC, Canada, IEEE, 3 pages.

Mohamed, A.M.M. et al., “Reconfigurable Doherty Amplifier for Efficient Amplification of Signals with Variable PAPR,” 2013 IEEE MTT-S International Microwave Symposium Digest (MTT), Jun. 2-7, 2013, Seattle, WA, USA, IEEE, 3 pages.

International Search Report and Written Opinion for International Patent Application No. PCT/US2021/057801, mailed Feb. 3, 2022, 18 pages.

Written Opinion for International Patent Application No. PCT/US2021/057801, mailed Feb. 14, 2023, 6 pages.

International Preliminary Report on Patentability for International Patent Application No. PCT/US2021/057801, mailed Jun. 12, 2023, 17 pages.

* cited by examiner

DOHERTY AMPLIFIER SYSTEM

RELATED APPLICATIONS

This application is a 35 USC 371 national phase filing of International Application No. PCT/US2021/057801, filed Nov. 3, 2021, which claims the benefit of provisional patent application Ser. No. 63/163,209, filed Mar. 19, 2021, the disclosures of which are incorporated herein by reference in their entireties.

FIELD OF THE DISCLOSURE

The present disclosure relates to amplifiers that are responsive to dynamic peak-to-average power ratios and in particular to improving efficiency of Doherty-type amplifiers.

BACKGROUND

Doherty power amplifiers as currently designed are intended to provide a high lineup efficiency in the face of modern modulation techniques that generate high peak-to-average power signals. Traditionally, a designer of a Doherty amplifier starts designing the Doherty amplifier with a specific peak-to-average power ratio (PAPR) in mind. Then the designer adjusts an amount of amplifier asymmetry between a carrier amplifier and a peak amplifier that make up the Doherty amplifier in order to place a Doherty efficiency "tent" in the vicinity of a desired average output power.

However, in actual deployments of a Doherty amplifier in a basestation such as an Evolved Node B (eNodeB) of a communications network, it may be necessary for the communications network to employ signals having PAPRs that are different from PAPRs for which the Doherty amplifier was designed. In such a case there are a number of possible outcomes, all of which result in sub-optimal performance. For example, if the Doherty amplifier is designed for a low PAPR and the eNodeB switches to a high PAPR signal, then the Doherty amplifier may miss the Doherty efficiency tent entirely, and the efficiency of the Doherty amplifier is accordingly degraded. If, on the other hand, the Doherty amplifier is designed for high PAPR signals, a low PAPR signal may operate within the Doherty efficiency tent. However, Doherty efficiency tents are typically lower for high PAPRs than for low PAPRs. Thus, if a low PAPR scenario is more common, the overall eNodeB performance suffers over time from committing the Doherty amplifier to a less-used case of a higher PAPR than necessary. As such, there is a need for Doherty amplifier system that is responsive to dynamic PAPRs.

SUMMARY

A Doherty amplifier system is disclosed having a carrier amplifier with a carrier drain bias input, and a peak amplifier having a peak drain bias input, and a peak gate bias input. Also included is a programmable bias controller having a data interface configured to receive peak-to-average power ratio (PAPR) data associated with a basestation. The programmable bias controller further includes a processor coupled to the data interface and configured, in response to the PAPR data, to determine and apply bias levels to the carrier drain bias input, the peak drain bias input, and the peak gate bias input to provide an amplifier efficiency between 30% and 78.5%.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
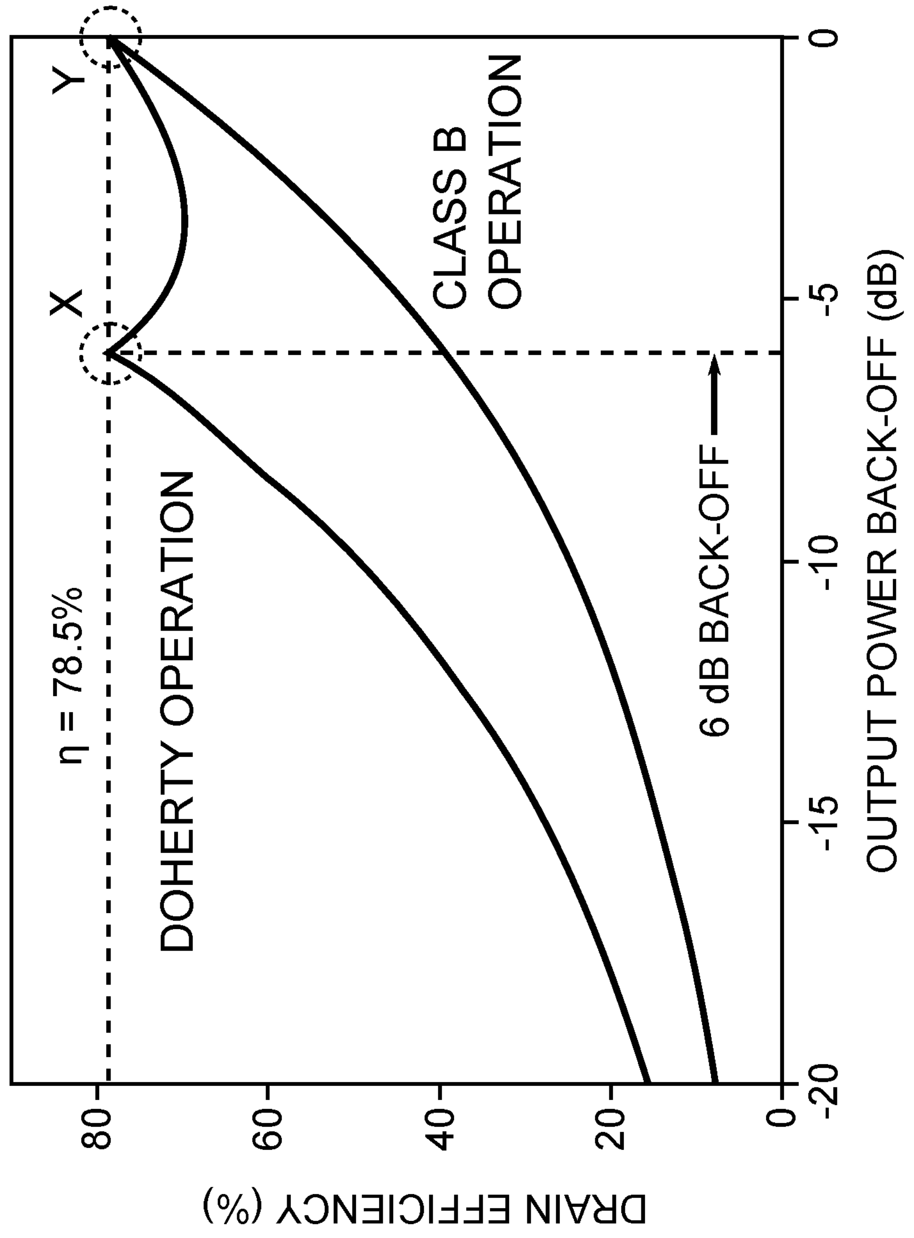
FIG. 1 is a diagram showing a typical power efficiency tent for a Doherty amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a Doherty amplifier system that generates software-controllable bias voltages for the carrier drain bias, the peak drain bias, and the peak gate bias for a Doherty amplifier. The provided freedom to adjust these parameters under software control allows the Doherty power amplifier to adapt to various peak-to-average power ratios (PAPRs), raising the power efficiency of a communications network such as a 5G cellular network. An advantage of embodiments according to the present disclosure is that the embodiments allow for higher transmitter efficiency under dynamic PAPR variations.

FIG. 1 is a diagram showing a typical power efficiency tent for a Doherty amplifier. Points labeled X and Y in the diagram are controlled by drain and gate bias of the Doherty amplifier, which includes a carrier amplifier and a peak amplifier. For example, the drain bias of the carrier amplifier may be set at point X to place the carrier amplifier into saturation. Also, at point X, the gate bias of the peak amplifier is set to turn the peak amplifier on. At point Y, the drain bias of the peak amplifier determines the maximum output power of the Doherty amplifier. Advantages provided by embodiments of the present disclosure include near continual maximization of power efficiency under processor control and added flexibility in setting most appropriate bias levels for various modulation schemes for radio frequency signals to be amplified by the Doherty amplifier.

Figure 2:
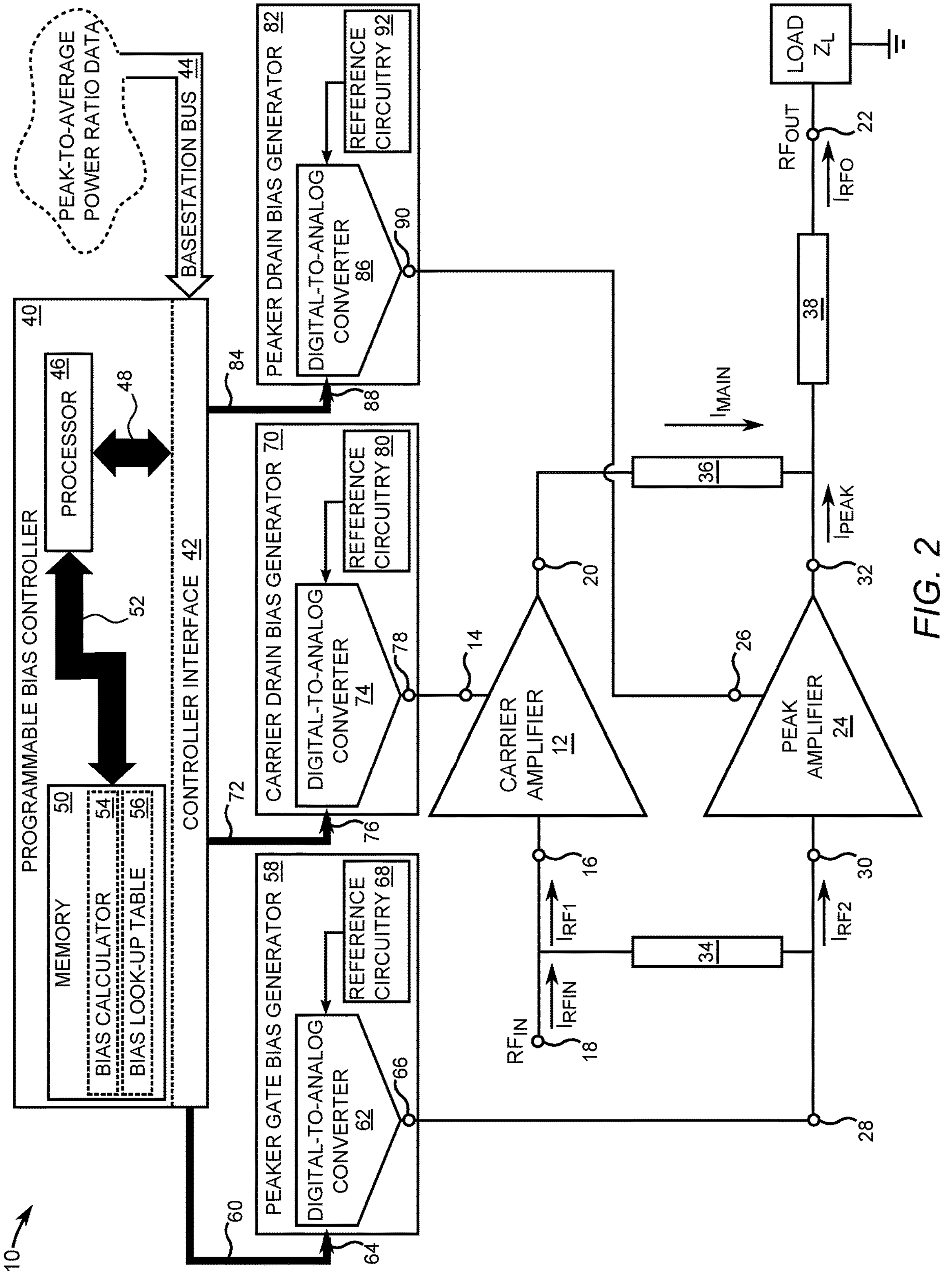
FIG. 2 is a high-level diagram of the implementation of a first exemplary embodiment according to the present disclosure.

FIG. 2 shows a block diagram of an exemplary embodiment of a Doherty amplifier system 10 according to the present disclosure. The Doherty amplifier system 10 includes a carrier amplifier 12 having a carrier drain bias input 14, a main input 16 for receiving a first portion $I_{RF1}$ of a radio frequency (RF) signal $I_{RFIN}$ arriving at an RF input 18 and a main output 20 in communication with a RF signal output 22. Further included is a peak amplifier 24 having a peak drain bias input 26, a peak gate bias input 28, a peak input 30 for receiving a second portion $I_{RF2}$ of the RF signal $I_{RFIN}$, and a peak output 32 in communication with the RF signal output 22.

The Doherty amplifier system 10 further includes an input coupler 34 coupled between the RF input 18 and the peak input 30. The input coupler 34 provides the second portion $I_{RF2}$ of the RF signal $I_{RFIN}$ to the peak amplifier 24 through the peak input 30. The input coupler 34 typically provides a phase shift of 90°±5° to the second portion $I_{RF2}$ of the RF signal $I_{RFIN}$. In exemplary embodiments, the input coupler 34 may be a quadrature coupler such as a branchline coupler or a Lange coupler.

The Doherty amplifier system 10 also further includes an output coupler 36 coupled between the main output 20 and the RF signal output 22. The output coupler 36 provides a phase shift to a main current $I_{MAIN}$ needed to properly combine the main current $I_{MAIN}$ with a peak current $I_{PEAK}$ to form an output current $I_{RFO}$ that flows from the RF signal output 22 through an impedance transform 38 into a load $Z_L$. A typical phase shift applied to the main current $I_{MAIN}$ is 90°±5°. In exemplary embodiments, the output coupler 36 may be a quadrature coupler such as a branchline coupler or a Lange coupler. The impedance transform 38 may be microstrip type to form an output current $I_{RFO}$ that flows through an impedance transform 38 to the RF signal output 22 and into a load $Z_L$.

The Doherty amplifier system 10 also includes a programmable bias controller 40 that is configured, in response to PAPR data associated with a basestation, to determine and apply bias levels to the carrier drain bias input 14, the peak drain bias input 26, and the peak gate bias input 28 to provide a desired amplifier efficiency between 30% and 78.5%. In particular, the programmable bias controller 40 has a controller interface 42 that is configured to receive the PAPR data, which is transferred over a basestation bus 44. The programmable bias controller 40 includes a processor 46 coupled to the controller interface 42 by way of a first internal bus 48. A memory 50 is coupled to the processor 46 through a second internal bus 52. The memory 50 may be a mix of random-access memory (RAM) for storing volatile data including processor instructions and read-only memory (ROM) for storing non-volatile data and firmware that includes processor instructions. The processor instructions for the processor 46 may include a bias calculator 54 that utilizes values stored in a bias look-up table 56 to determine amplifier efficiency maximizing bias levels for carrier drain bias, peak drain bias, and gate bias to maintain the desired amplifier efficiency.

The Doherty amplifier system 10 also includes a peak gate bias generator 58 coupled between the processor 46 and the peak gate bias input 28 by way of the controller interface 42 and a first controller bus 60. The peak gate bias generator 58 is configured to output a peak gate bias level determined by the processor 46. To generate and apply the peak gate bias level, the peak bias generator 58 of the exemplary embodiment of FIG. 2 includes a first digital-to-analog converter 62 having a first digital input 64 coupled to the first controller bus 60 and a first analog output 66 in communication with the peak gate bias input 28. During operation, the processor 46 sends a digital bias value to the first digital-to-analog converter 62 that is converted into a proportion analog gate bias level that is scaled by a first reference circuitry 68.

The Doherty amplifier system 10 further includes a carrier drain bias generator 70 coupled between the processor 46 and the carrier drain bias input 14 by way of the controller interface 42 and a second controller bus 72. The carrier bias generator 70 is configured to output a carrier drain bias level determined by the processor 46. In order to generate and apply the carrier drain bias level, the carrier drain bias generator 70 of the exemplary embodiment of FIG. 2 includes a second digital-to-analog converter 74 having a second digital input 76 coupled to the second controller bus 72 and a second analog output 78 in communication with the carrier drain bias input 14. During operation, the processor 46 sends a digital bias value to the second digital-to-analog converter 74 that is converted into a proportion analog carrier drain bias level that is scaled by a second reference circuitry 80.

The Doherty amplifier system 10 also further includes a peak drain bias generator 82 coupled between the processor 46 and the peak drain bias input 26 by way of the controller interface 42 and a third controller bus 84. The peak drain bias generator 82 is configured to output a peak drain bias level determined by the processor 46. To generate and apply the peak drain bias level, the peak drain bias generator 82 of the exemplary embodiment of FIG. 2 includes a third digital-to-analog converter 86 having a third digital input 88 coupled to the third controller bus 84 and a third analog output 90 in communication with the peak drain bias input 26. During operation, the processor 46 sends a digital bias value to the third digital-to-analog converter 86 that is converted into a proportion analog peak drain bias level that is scaled by a third reference circuitry 92. The first digital-to-analog converter 62, the second digital-to analog converter 74, and the third digital-to-analog converter 86 may be of the M-bit type wherein M is a natural counting number. Examples of M may be, but are not limited to, 2, 4, 6, 8, 16, 32, and 64.

Figure 3:
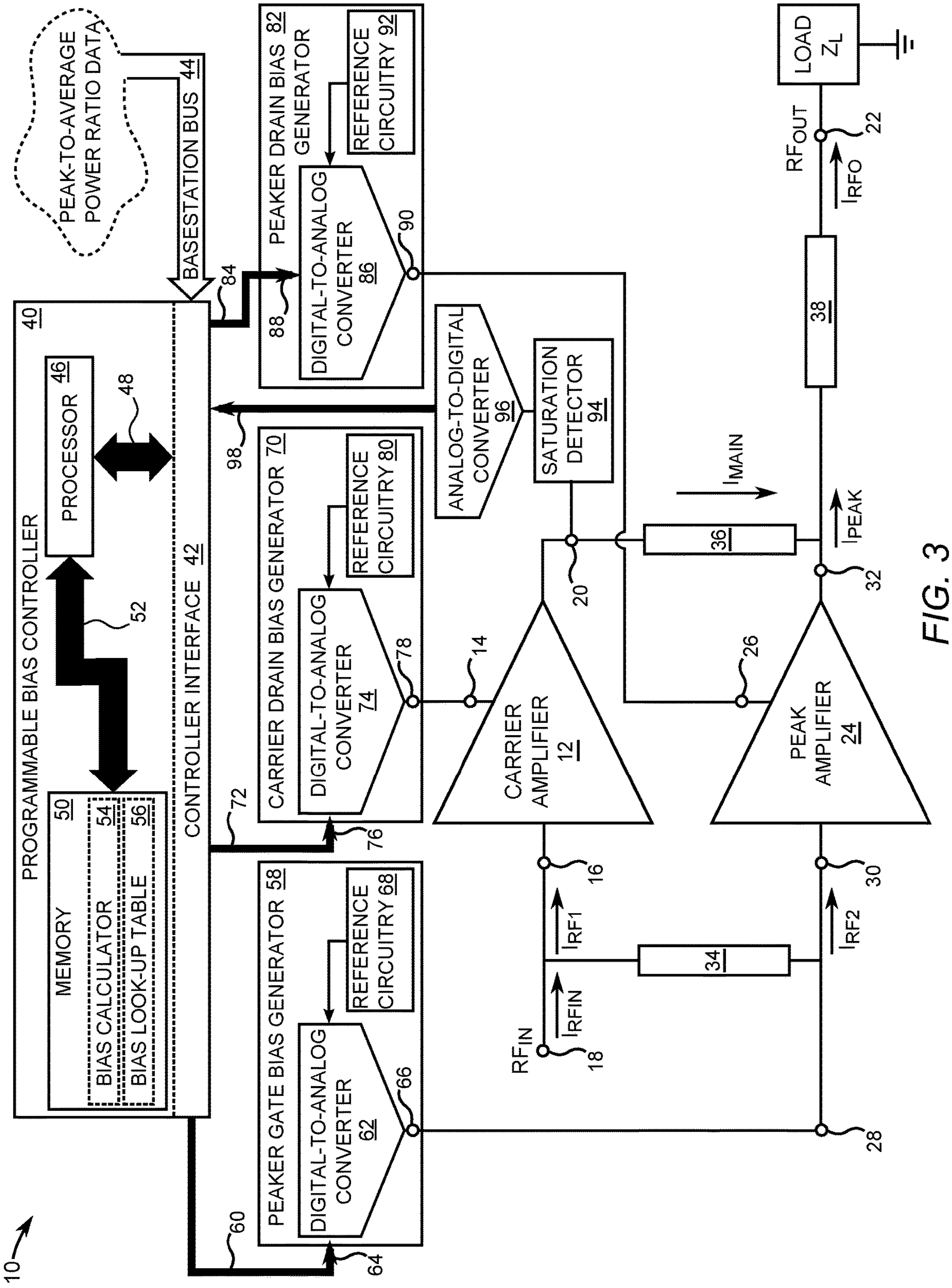
FIG. 3 is a high-level diagram of the implementation of a second exemplary embodiment according to the present disclosure.

Note that while there are advantages to receiving adjustment information from a basestation such as an eNodeB, in some implementations it may be desirable to determine additional power amplifier bias settings through more local measurements and processing. FIG. 3 is a high-level diagram of the implementation of a second exemplary embodiment of the Doherty amplifier system 10 according to the present disclosure. The second exemplary embodiment includes a saturation detector 94 that is coupled to the main output 20 of the carrier amplifier 12. The saturation detector 94 is configured to measure voltage at the main output 20 and to generate an analog output indicative of the carrier amplifier 12 either entering or exiting saturation. An analog-to-digital converter 96 receives the analog output from the saturation detector 94. The analog-to-digital converter 96 is configured to output a digital saturation value that is proportional to the analog output received from the saturation detector 94. The analog-to-digital converter 96 is coupled to the controller interface 42 through a fourth controller bus 98 to pass the digital saturation value to the processor 46. The processor 46 and the bias calculator 54 are further configured to respond to the digital saturation value and adjust the peak gate bias, the carrier drain bias, and the peak drain bias by way of the peak gate bias generator 58, the carrier drain bias generator 70, and the peak drain bias generator 82 in order to maintain maximum amplifier efficiency. In some embodiments, the analog-to-digital converter 96 may be a one-bit analog-to-digital converter, and in other embodiments, the analog-to-digital converter 96 may be an N-bit analog-to-digital converter wherein N is a natural counting number. Examples of N may be, but are not limited to, 2, 4, 6, 8, 16, 32, and 64.

For higher power operation with either exemplary embodiment of the Doherty amplifier system 10 depicted in FIG. 2 and FIG. 3, the processor 46 and the bias calculator 54 are configured to raise the carrier drain bias level so that the carrier amplifier 12 will saturate at a higher output power. The processor 46 and the bias calculator 54 are also configured to simultaneously lower the peak drain bias level of the peak amplifier 24 because less saturation power is needed with the carrier amplifier 12 being biased at a higher drain bias level. The processor 46 and the bias calculator 54 are also further configured to simultaneously adjust the peak gate bias so that the peak amplifier 24 will become active only when additional saturation power is needed.

For lower power operation with either exemplary embodiment of the Doherty amplifier system 10 depicted in FIG. 2 and FIG. 3, the processor 46 and the bias calculator 54 are configured to lower the carrier drain bias level so that the carrier amplifier 12 will saturate at a lower output power. The processor 46 and the bias calculator 54 are also configured to simultaneously raise the peak drain bias level of the peak amplifier 24 because more saturation power is needed with the carrier amplifier 12 being biased at a lower drain bias level. The processor 46 and the bias calculator 54 are also further configured to simultaneously adjust the peak gate bias so that the peak amplifier 24 will become active earlier when additional saturation power is needed. It is to be understood that the bias level adjustments may be made by either continuously or in discrete steps.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein. For example, the programmable bias controller 40 may be realized with a traditional digital processor and memory, a field-programmable gate array, and an application-specific integrated circuit, or combinations thereof. Moreover, the Doherty amplifier system 10 may be integrated into one module or may have one module dedicated to the carrier amplifier 12, the peak amplifier 24, and the bias generators 58, 70, 82 with the programmable bias controller 40 being fabricated into a separate module.

Those skilled in the art will recognize improvements and modifications to the preferred embodiments of the present disclosure. All such improvements and modifications are considered within the scope of the concepts disclosed herein and the claims that follow.

What is claimed is:

1. A Doherty amplifier system comprising:

a carrier amplifier having a carrier drain bias input, a main input for receiving a first portion of a radio frequency (RF) signal, and a main output in communication with a RF signal output;

a peak amplifier having a peak drain bias input, a peak gate bias input, a peak input for receiving a second portion of the RF signal, and a peak output in communication with the RF signal output;

a programmable bias controller comprising:

a controller interface configured to receive peak-to-average power ratio (PAPR) data associated with a basestation; and a processor coupled to the controller interface and a memory with a bias look-up table, wherein the processor is configured, in response to the PAPR data, to determine bias levels by way of the look-up table; and a carrier drain bias generator coupled between the processor and the carrier drain bias input, wherein the carrier drain bias generator comprises a second digital-to-analog converter having a second digital input coupled to the processor and a second analog output in communication with the carrier drain bias input and is configured to output a carrier drain bias level determined by the processor;

a peak drain bias generator coupled between the processor and the peak drain bias input, wherein the peak drain bias generator comprises a third digital-to-analog converter having a third digital input coupled to the processor and a third analog output in communication with the peak drain bias input and is configured to output a peak drain bias level determined by the processor; and a peak gate bias generator coupled between the processor and the gate bias input, wherein the peak bias generator comprises a first digital-to-analog converter having a first digital input coupled to the processor and a first analog output in communication with the peak gate bias input and is configured to output a peak gate bias level determined by the processor;

a saturation detector coupled to the main output; and an analog-to-digital converter coupled between the saturation detector and the processor, wherein the analog-to-digital converter is configured to receive an analog output from the saturation detector and send a digital saturation value to the processor, wherein the processor is further configured to respond to the digital saturation value and apply the bias levels to the carrier drain bias input, the peak drain bias input, and the peak gate bias input to maintain an amplifier efficiency between 30% and 78.5%.

2. The Doherty amplifier system of claim 1 wherein for higher power operation the processor is configured to raise the carrier drain bias level.

3. The Doherty amplifier system of claim 1 wherein for higher power operation the processor is configured to lower the peak drain bias level.

4. The Doherty amplifier system of claim 1 wherein for higher power operation the processor is configured to lower the peak gate bias level.

5. The Doherty amplifier system of claim 1 wherein for higher power operation the processor is configured to simultaneously raise the carrier drain bias level, lower the peak drain bias level, and lower the peak gate bias level.

6. The Doherty amplifier system of claim 1 wherein for lower power operation the processor is configured to lower the carrier drain bias level.

7. The Doherty amplifier system of claim 1 wherein for lower power operation the processor is configured to raise the peak drain bias level.

8. The Doherty amplifier system of claim 1 wherein for lower power operation the processor is configured to adjust the peak gate bias level so that the peak amplifier is active to provide additional power only when the carrier amplifier saturates.

9. The Doherty amplifier system of claim 1 wherein for lower power operation the processor is configured to simultaneously raise the carrier drain bias level, raise the peak drain bias level, and adjust the peak gate bias level so that the peak amplifier is active to provide additional power only when the carrier amplifier saturates.

10. The Doherty amplifier system of claim 1 wherein the processor is further configured to respond to the digital saturation value and adjust the carrier drain bias level by way of the carrier drain bias generator to maintain maximum amplifier efficiency between 30% and 78.5%.

11. The Doherty amplifier system of claim 1 wherein the processor is further configured to respond to the digital saturation value and adjust the peak drain bias level by way of the peak drain bias generator to maintain maximum amplifier efficiency between 30% and 78.5%.

12. The Doherty amplifier system of claim 1 wherein the processor is further configured to respond to the digital saturation value and adjust the peak gate bias level by way of the peak gate bias generator to maintain amplifier efficiency between 30% and 78.5%.

13. The Doherty amplifier system of claim 1 wherein the processor is further configured to respond to the digital saturation value and simultaneously adjust the carrier drain bias level by way of the carrier drain bias generator, adjust the peak drain bias level by way of the peak drain bias generator, and adjust the peak gate bias level by way of the peak gate bias generator to maintain amplifier efficiency between 30% and 78.5%.

14. The Doherty amplifier system of claim 1 wherein the memory is a mix of random-access memory (RAM) for storing volatile data including processor instructions and read-only memory (ROM) for storing non-volatile data and firmware that includes processor instructions.

15. The Doherty amplifier system of claim 1 wherein the amplifier efficiency is maintained between 35% and 78.5%.

16. The Doherty amplifier system of claim 1 wherein the amplifier efficiency is maintained between 40% and 78.5%.

* * * * *